(12) United States Patent
Knickerbocker

(10) Patent No.: US 7,486,525 B2
(45) Date of Patent: Feb. 3, 2009

(54) TEMPORARY CHIP ATTACH CARRIER

(75) Inventor: John Ulrich Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/499,573

(22) Filed: Aug. 4, 2006

(65) Prior Publication Data

US 2008/0285244 A1  Nov. 20, 2008

(51) Int. Cl.
*H05K 7/00* (2006.01)

(52) U.S. Cl. ............... 361/760; 361/761; 361/764; 361/767; 174/261; 174/262

(58) Field of Classification Search ............ 29/846, 29/885; 174/260–262; 257/686, 688, 693, 257/777; 324/754–757, 761; 361/767, 760, 361/761, 764; 438/613, 637; 439/66, 70, 439/591, 862
See application file for complete search history.

(56) References Cited

U.S. PATENT DOCUMENTS

| | | | | |
|---|---|---|---|---|
| 5,767,580 | A * | 6/1998 | Rostoker | 257/737 |
| 5,772,451 | A * | 6/1998 | Dozier et al. | 439/70 |
| 5,800,184 | A * | 9/1998 | Lopergolo et al. | 439/66 |
| 5,880,590 | A * | 3/1999 | Desai et al. | 324/757 |
| 5,915,977 | A * | 6/1999 | Hembree et al. | 439/74 |
| 6,188,231 | B1 * | 2/2001 | Palagonia | 324/754 |
| 6,208,025 | B1 * | 3/2001 | Bellaar et al. | 257/696 |
| 6,228,468 | B1 * | 5/2001 | Vodrahalli | 428/210 |
| 6,336,269 | B1 * | 1/2002 | Eldridge et al. | 29/885 |
| 6,365,967 | B1 * | 4/2002 | Akram et al. | 257/734 |
| 6,555,764 | B1 * | 4/2003 | Maruyama et al. | 174/267 |
| 6,917,525 | B2 * | 7/2005 | Mok et al. | 361/767 |
| 2001/0048591 | A1 * | 12/2001 | Fjelstad et al. | 361/767 |
| 2002/0076919 | A1 * | 6/2002 | Peters et al. | 438/637 |
| 2002/0175695 | A1 * | 11/2002 | Ahmann et al. | 324/761 |
| 2003/0104687 | A1 * | 6/2003 | Abreu et al. | 438/613 |
| 2006/0200965 | A1 * | 9/2006 | Farooq et al. | 29/426.3 |

* cited by examiner

*Primary Examiner*—Tuan Dinh
*Assistant Examiner*—Xiaoliang Chen
(74) *Attorney, Agent, or Firm*—Schmeiser, Olsen & Watts; Robert M. Trepp

(57) ABSTRACT

A temporary chip attach carrier for and a method of testing an integrated circuit chip. The carrier includes: a substrate, a first array of interconnects disposed on a bottom surface and a second array of interconnects disposed on a top surface of the substrate, corresponding interconnects of the first and second arrays of interconnects electrically connected by wires in the substrate; an interposer, a first array of pads disposed on a top surface of the interposer and a second array of pads disposed on a bottom surface of the interposer, corresponding pads of the first and second arrays of pads electrically connected by wires in the interposer, and pads of the second array in direct physical and electrical contact with corresponding interconnects of the second set of interconnects; and wherein the interposer includes an interposer substrate of the same material as a substrate of the integrated circuit chip.

17 Claims, 9 Drawing Sheets

US 7,486,525 B2

TEMPORARY CHIP ATTACH CARRIER

This invention was made with Government support under Contract No.: NBCH3039004 awarded by the Defense Advanced Research Project Agency (DARPA), and H98230-04-C-0920 awarded by the Maryland Procurement Office. The Government has certain rights in this invention.

FIELD OF THE INVENTION

The present invention relates to the field of integrated circuit testing; more specifically, it relates to a temporary chip attach carrier to which integrated circuit chips may be attached for testing.

BACKGROUND OF THE INVENTION

One method of testing integrated circuit chips, particularly when the testing is to be done at temperatures other than room-temperature, is to temporarily attach the integrated circuit chip to a carrier which may then be placed in an environmental chamber whose temperature, atmosphere and humidity levels may be controlled. A tester is connected to the chip to be tested via the carrier and the test performed. After testing is complete, the integrated circuit chip is removed from the carrier.

However, as the size and pitch of integrated circuit chip interconnects, for example solder balls, has decreased (become finer), it has become much more difficult to remove the integrated circuit from the carrier without damaging the integrated circuit chip. Therefore, there is a need for a temporary chip attach (TCA) carrier suitable for use in testing fine pitch interconnect integrated circuit chips.

SUMMARY OF THE INVENTION

A first aspect of the present invention is a temporary chip attach carrier for an integrated circuit chip, a substrate, a first array of interconnects disposed on a bottom surface of the substrate and a second array of interconnects disposed on a top surface of the substrate, corresponding interconnects of the first and second arrays of interconnects electrically connected by wires in the substrate; an interposer, a first array of pads disposed on a top surface of the interposer and a second array of pads disposed on a bottom surface of the interposer, corresponding pads of the first and second arrays of pads electrically connected by wires in the interposer, and pads of the second array of pads in direct physical and electrical contact with corresponding interconnects of the second array of interconnects; and wherein the interposer comprises an interposer substrate comprises a same material as a substrate of the integrated circuit chip.

A second aspect of the present invention is a method, comprising: attaching one or more integrated circuit chips to an interposer of a temporary chip attach carrier, the carrier comprising: a substrate, a first array of interconnects disposed on a bottom surface of the substrate and a second array of interconnects disposed on a top surface of the substrate, corresponding interconnects of the first and second arrays of interconnects electrically connected by wires in the substrate; the interposer, a first array of pads disposed on a top surface of the interposer and a second array of pads disposed on a bottom surface of the interposer, corresponding pads of the first and second arrays of pads electrically connected by wires in the interposer, and pads of the second array in direct physical and electrical contact with corresponding interconnects of the second array of interconnects; and wherein the interposer includes an interposer substrate comprising a same material as a substrate of the integrated circuit chip; connecting interconnects of the first array of interconnects to a tester; and testing the one or more integrated circuit chips, the testing comprising at least one of functional testing and reliability testing.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Examples of testing integrated circuits include functional testing and reliability testing, testing using DC signals and testing using AC signals. Examples of reliability testing include testing at temperatures above room temperature, at humidity levels above about 85% relative humidity, at voltage levels higher than the designed operating voltage of the integrated circuit chip, for currents equal to or higher than the design for circuit operation with DC, AC or pulsed current flow, in atmospheres other than air and combinations thereof. In one example, reliability test conditions are designed to accelerate failure rates or to simulate the condition of the integrated circuit chip at an end-of life.

In one example, a fine pitch interconnect is a pitch wherein the maximum dimension of the integrated circuit interconnect is about 100 microns or less and the pitch between the interconnects is about 200 microns or less.

Figure 1:
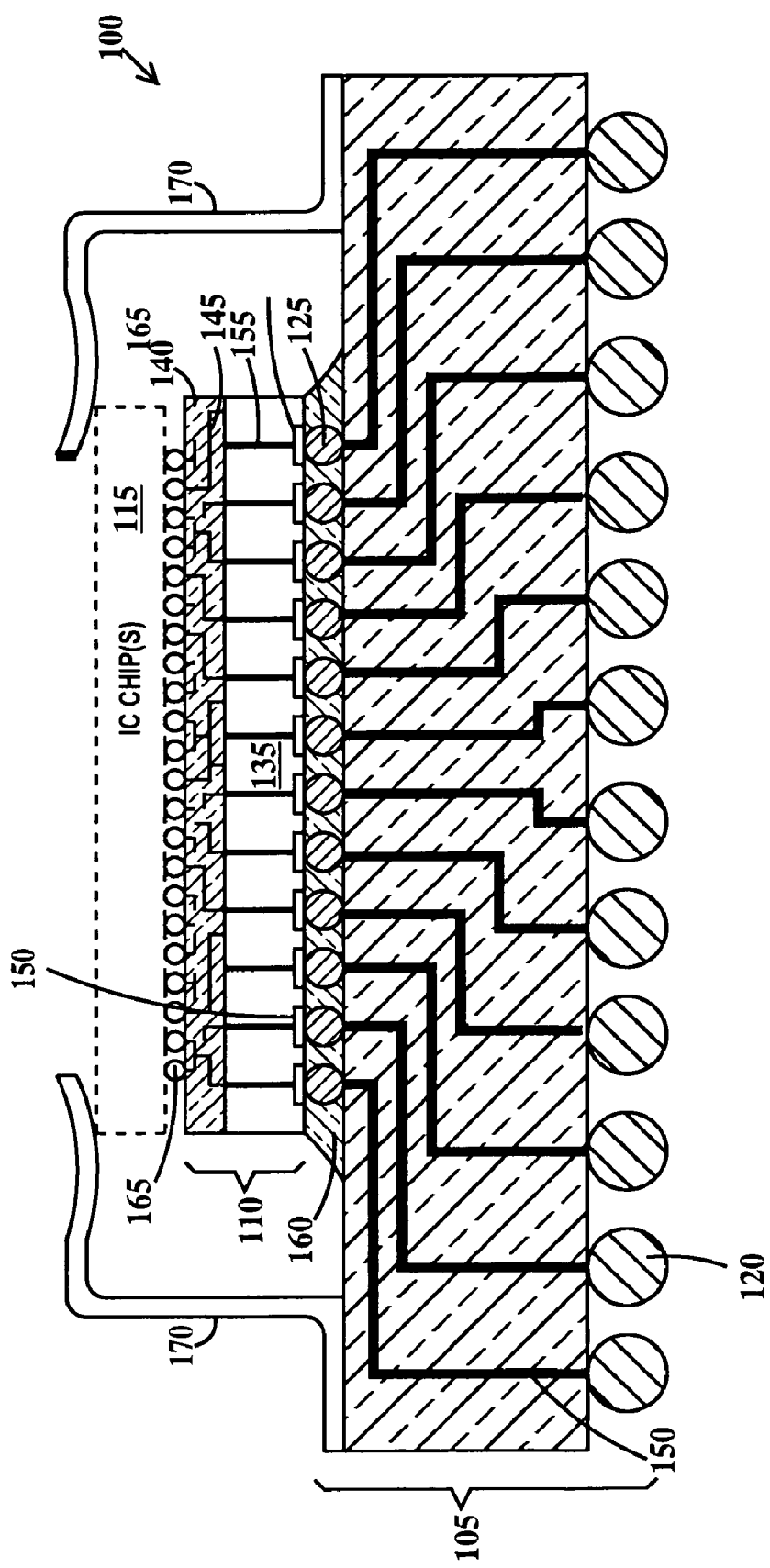
FIG. 1 is a cross-sectional view of a temporary chip attach carrier according to embodiments of the present invention.

FIG. 1 is a cross-sectional view of a temporary chip attach carrier according to embodiments of the present invention. In FIG. 1, a temporary chip attach (TCA) carrier 100 includes a substrate 105 and an interposer 110 to which one or more integrated circuit chips 115 may be temporarily attached for testing.

Substrate 105 includes a multiplicity of interconnects 120, on a bottom surface of the substrate, connected to corresponding solder bumps 125, on a top surface of the substrate, by wires 130. In one example interconnects 120 are a ball grid array (BGA) (illustrated), a solder column grid array (CGA), a copper column grid array (CCGA), a land grid array (LGA) or an array of pins. In one example substrate 105 is a single or multiple layer ceramic module or a single or multiple layer organic module (i.e., a printed circuit board (PCB)).

Interposer 110 includes a substrate portion 135 and a wiring portion 140. Substrate portion 135 and wiring portion 140 may each independently include active and passive devices, examples of which include, but are not limited to, transistors, diodes, capacitors (including decoupling capacitors) resistors and inductors. Examples of capacitors types include, but are limited to, gate capacitors, plate capacitors and trench capacitors. Interposer 110 may also include electrostatic discharge (ESD) protection devices and circuits. Interposer 110 may also include circuits for measuring temperature, for generating test patterns for self-checking TCA carrier 100 to ensure the TCA carrier is operating normally. Interposer 110 may also include one or more conductive through vias (openings formed through substrate 135 from a back surface to an opposite front surface of the substrate and filled with an electrically conductive material with provision to electrically isolate the conductive material from the substrate itself to avoid shorting adjacent through vias), one or more electrically conductive wires, a power distribution plane. Specific test functions for testing of integrated circuit chip(s) 115 may be incorporated into circuits in interposer 110, examples of which include, but are not limited to pattern logic testing, memory pattern testing, retention time testing. Wires 145 in wiring portion 140 interconnect either mini-pads or micro-probe tips (not shown in FIG. 1, see FIGS. 2A through 2E and FIGS. 3A and 3B respectively), on a top surface of interposer 110 (as described infra) to backside pads 150 through electrically conductive through-vias 155 formed in substrate portion 135. An optional curable polymeric fill material 160 may be injected between the bottom surface of interposer 110 and the top surface of substrate 105. The fill material may include a powdered material having a coefficient of thermal expansion similar to that of substrate portion 135.

Integrated circuit chip(s) 115 include solder bump interconnects 165 also known as controlled chip collapse connections (C4s). Solder bumps 165 are permanently attached to integrated circuit chip(s) 115 and are temporarily solder attached to the mini-pads or held in aspirate contact with the micro-probes (not shown in FIG. 1, see FIGS. 2A through 2E and FIGS. 3A and 3B) on the top surface of interposer 110. In the case of probes, an optional clamping device 170 (shown as spring clips, but any clamping mechanism known in the art may be used) is attached to substrate 105 in order to press integrated circuit chip(s) 115 toward interposer 110.

Interposer 110 advantageously comprises a silicon substrate, fill material comprises epoxy resin and fill powder comprises silicon dioxide when integrated circuit chip(s) 115 comprise(s) a silicon substrate(s) and is fabricated using conventional integrated circuit processes. Fabricating interposer 110 from a silicon substrate when integrated circuit chip(s) 115 comprise(s) a silicon substrate(s) minimizes thermal expansion and contraction stresses by matching thermal expansion coefficients. Alternatively, interposer 110 may be fabricated using a substrate of the same material as the substrate used to fabricate integrated circuit chip(s) 115 to minimize thermally induced stresses. Examples of alternative substrate materials for interposer 110 include, but are not limited to, silicon-germanium, ruby and sapphire.

Figure 2A:
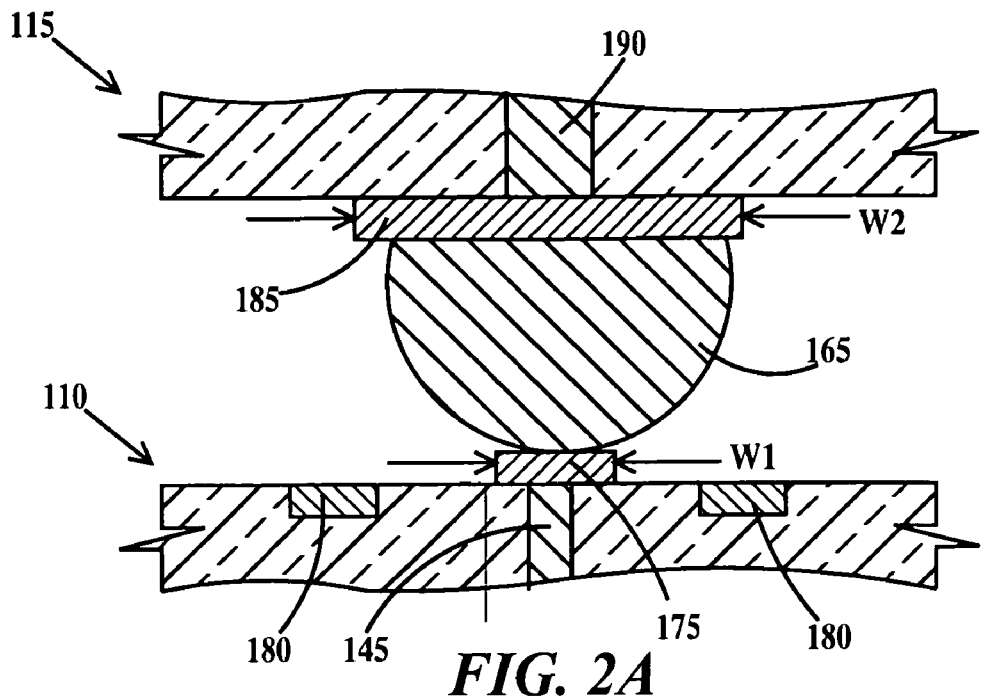
FIG. 2A is a detailed cross-section of a temporary connection between an integrated circuit chip and a temporary chip attach carrier according to a first embodiment of the present invention.

FIG. 2A is a detailed cross-section of a temporary connection between an integrated circuit chip and a temporary chip attach carrier according to a first embodiment of the present invention. In FIG. 2A, interposer 110 includes a mini-pad 175 on a top surface of the interposer electrically and physically connected to a wire 145. Mini-pad 175 has at least one lateral dimension of W1. Interposer 110 may include optional electrical resistance heaters 180 proximate to mini-pad 175 for heating and softening solder bump 165 as an aid in removing integrated circuit chip(s) 115 from the interposer after testing. Also in FIG. 2A, integrated circuit chip(s) 115 have a terminal pad 185 electrically and physically connected to a wire 190 of a terminal wiring level of the integrated circuit chip(s). Integrated circuit chip(s) 115 are flip-chip attached to interposer 110, so the top surface of the integrated circuit faces the top surface of the interposer.

Terminal pad 185 has a maximum dimension of W2. In one example W2 is greater than W1. In one example W1 is equal to or less than about 30% of W2. In one example W1 is equal to or less than about 20% of W2. In one example W1 is between about 5% and about 30% of W2. In one example W2 is between about 2 microns and about 100 microns. Mini-pad 175 is advantageously significantly smaller then terminal pads 185 in order to facilitate removal of integrated circuit chip(s) 115 from interposer 110 and to leave most of solder bump 165 attached to the terminal pad after the removal. Min-pad 175 may comprise, for example, nickel or a layer of palladium over a layer of nickel. Terminal pad 185 may comprise, for example, a layer of titanium over a layer of tungsten, a layer of gold over a layer of nickel over a layer of copper, or a layer of gold over a layer of nickel over a layer of copper over a layer of chrome. A layer of solder may be applied to terminal pad 185 prior to joining active integrated circuit chips to obtain a residual solder volume on the surface of the terminal pad for consistent chip/to interposer solder volume, particularly if the interposer is to be used multiple times.

Integrated circuit chip(s) 115 are attached to interposer by re-flowing (heating) solder bumps 165. Then, TCA carrier 100 (see FIG. 1) is attached to a test board or in a socket attached to a test board using interconnects 120 (see FIG. 1) for testing. Next integrated circuit chip(s) 115 are tested. Then TCA carrier 100 (see FIG. 1) is removed from the test board or socket. Next, integrated circuit chip(s) 115 are detached from interposer 110 by shearing (applying a horizontal force relative to the top surface of an integrated circuit chip) with or without heating of solder bumps 165 or by pulling (applying a vertical force relative to the top surface of an integrated circuit chip) with heating of the solder bumps. One advantage of heating for horizontal shear, vertical pull or lift off of the interposer is a reduced force removal of the chip and another benefit can be the reflow of the solder bump in either in an additional later reflow step or during the removal step to restore the shape of the solder bump.

After integrated circuit chip(s) 115 are removed from interposer 110, solder bumps 165 may be reflowed to restore the solder bumps to the shape they had before being attached to the interposer.

TCA carrier 100 (see FIG. 1) may be cleaned after the integrated circuit chip(s) 115 is tested and removed by several methods. In a first example, an organic or water based solvent or ultrasonic agitation or mechanical cleaning such as brushing or combinations thereof may be used. In second example, any residual solder from solder bumps 165 may be removed by etching. In a third example, mechanical polishing or chemical-mechanical polishing is performed to remove a top surface layer of interposer 110 along with a top surface layer of mini-pad 175 and any residual solder from solder bump 165 remaining on the mini-pad. In the example of cleaning by polishing, it is advantageous that mini-pad 175 extend into interposer 110 a distance great enough to allow multiple chip attaches, de-attaches and polishing. TCA carrier 100 may be reused after a polishing clean has been performed as long as there is some thickness of mini-pad 175 remaining. Combinations of the first, second and third cleaning examples may also be employed.

Mini-pad 175 may be fabricated on the surface of interposer 110 (as illustrated in FIG. 2A) with electrical contact to wires 145 (or to electrically conductive through vias) or mini-pad 175 may be integrally formed with wire 145 (or an electrically conductive through via) and simply have a cross-section corresponding to that of a separate mini-pad.

Figure 2B:
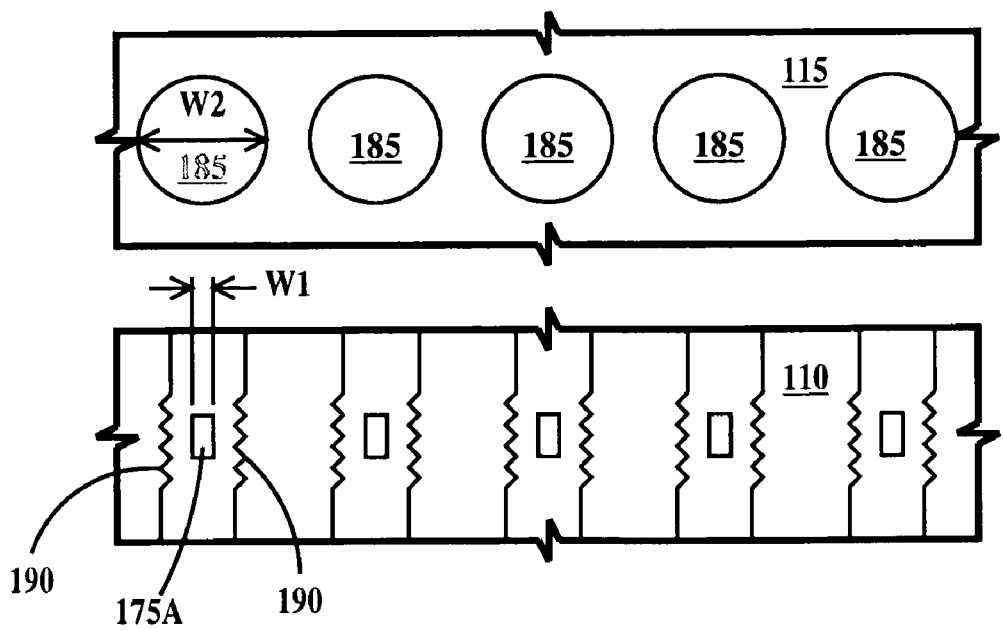
FIGS. 2B through 2E are top views of a temporary connection between an integrated circuit chip and a temporary chip attach carrier according to several variations of the first embodiment of the present invention.
Figure 2C:
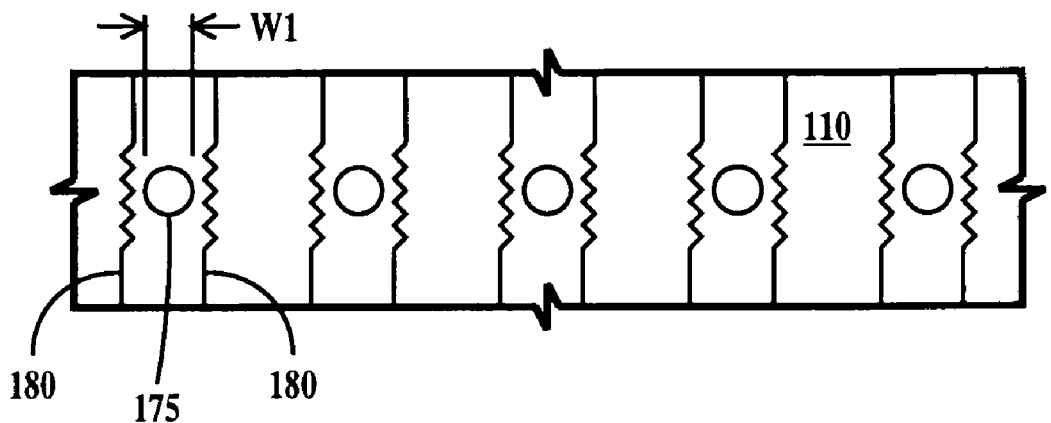
Figure 2D:
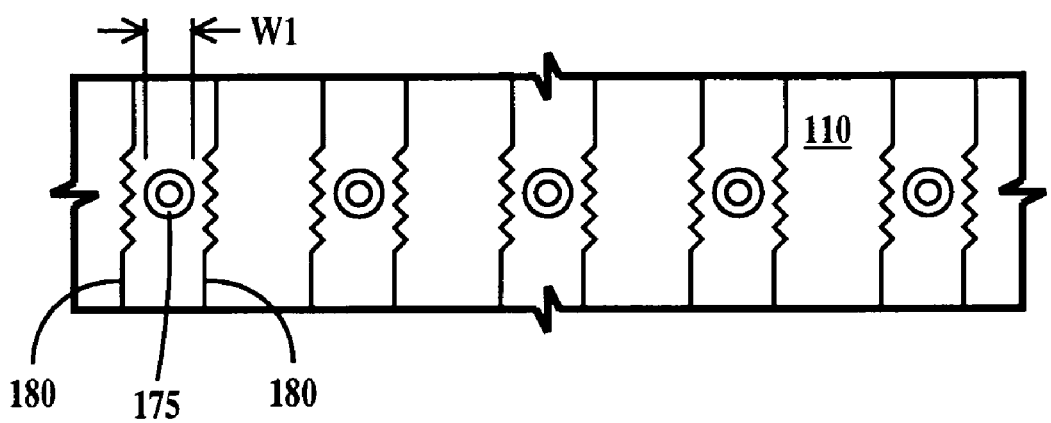
Figure 2E:
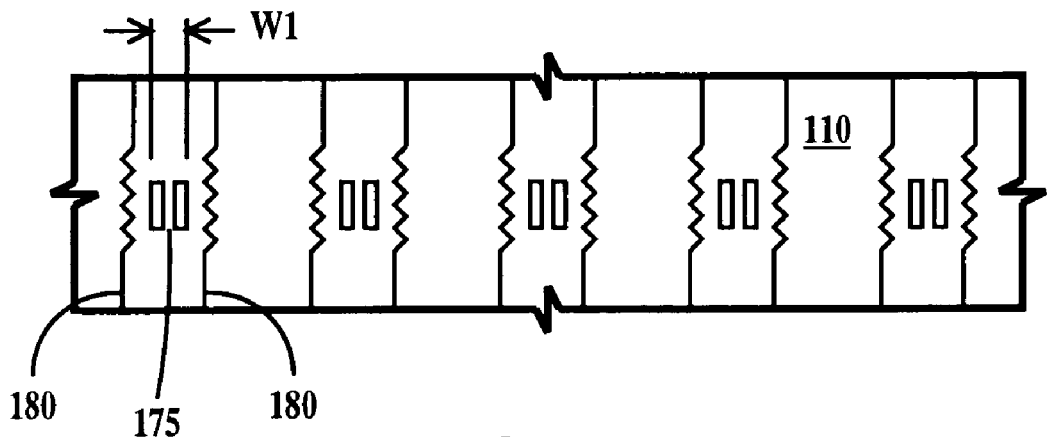

FIGS. 2B through 2E are top views of a temporary connection between an integrated circuit chip and a temporary chip attach carrier according to several variations of the first embodiment of the present invention. In FIG. 2B, terminal pads 185 of integrated circuit chip(s) 115 are circular with a diameter of W2. Terminal pads 185 may also be square, rectangular or polygonal in shape. Also in FIG. 2B, mini-pads 175A are rectangular with a minimum dimension of W1. Mini-pads 175A may also be square, rectangular or polygonal in shape. In FIG. 2C, mini-pads 175B are circular in shape having a diameter of W1. In FIG. 2D, mini-pads 175C are donut (annular ring) shaped having a diameter of W1. In FIG. 2E mini-pads 175D include two narrow and adjacent rectangular bars, the distance between outer opposite edges of the bars being W1.

Figure 3A:
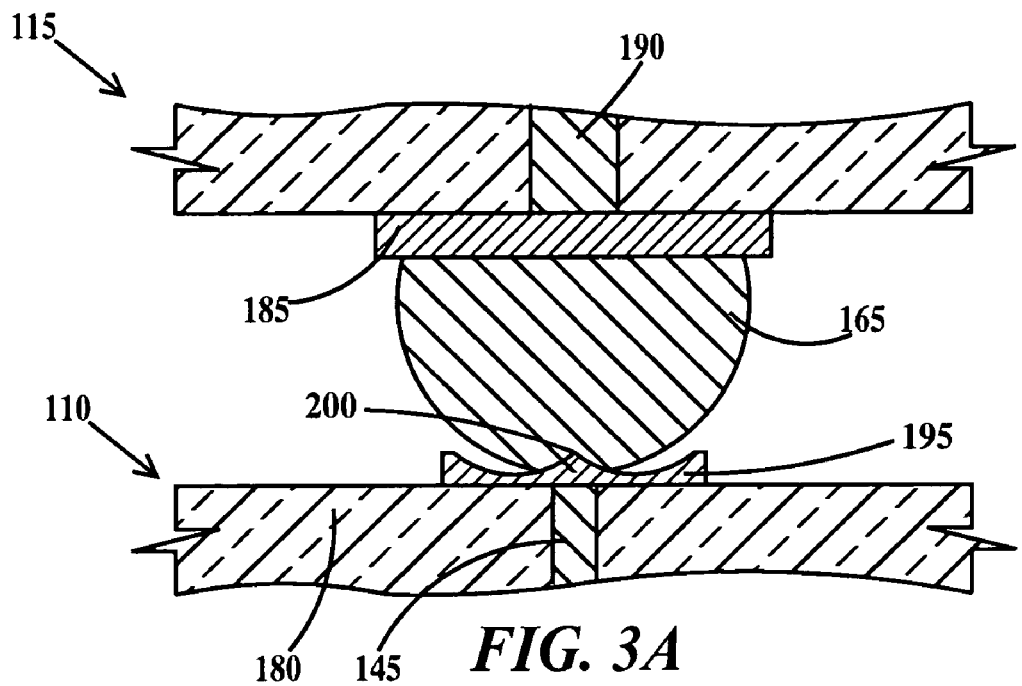
FIG. 3A is a detailed cross-section of a temporary connection between an integrated circuit chip and a temporary chip attach carrier according to a second embodiment of the present invention.
Figure 3B:
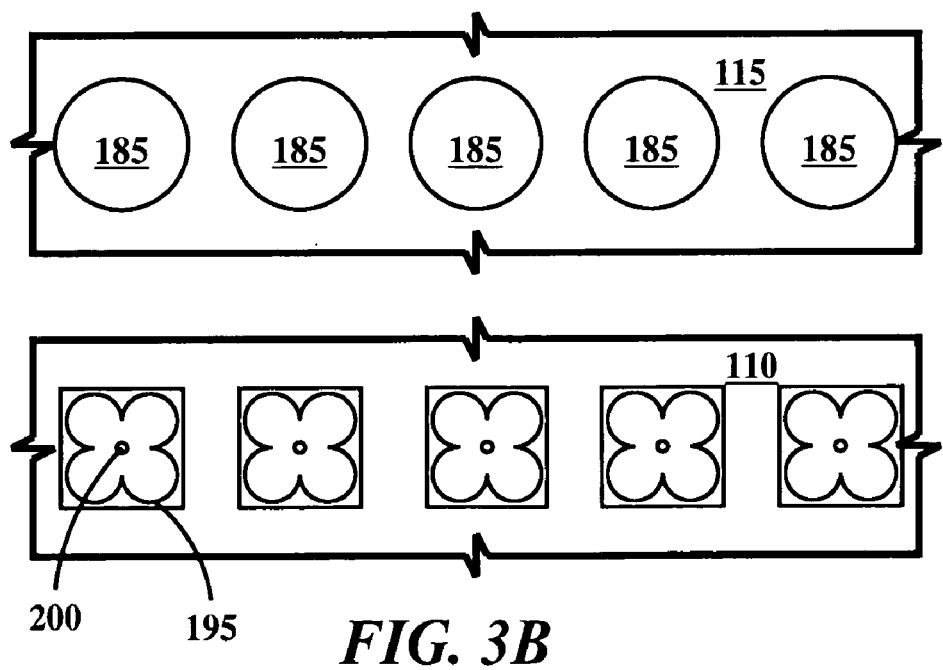
FIG. 3B is a top view of the temporary connection between an integrated circuit chip and a temporary chip attach carrier according to a second embodiment of the present invention.

FIG. 3A is a detailed cross-section of a temporary connection between an integrated circuit chip and a temporary chip attach carrier according to a second embodiment of the present invention and FIG. 3B is a top view of the temporary connection between an integrated circuit chip and a temporary chip attach carrier according to a second embodiment of the present invention. FIG. 3A is similar to FIG. 2A except mini-pad 175 of FIG. 2A is replaced with a probe pad 195 and a probe tip 200 of the probe pad is mechanically pressed into solder bump 165. FIG. 3B is similar to FIG. 2B, except mini-pads 175A of FIG. 2B are replaced by probes 195 and heaters 190 (see FIG. 2B) are not present.

Figure 4A:
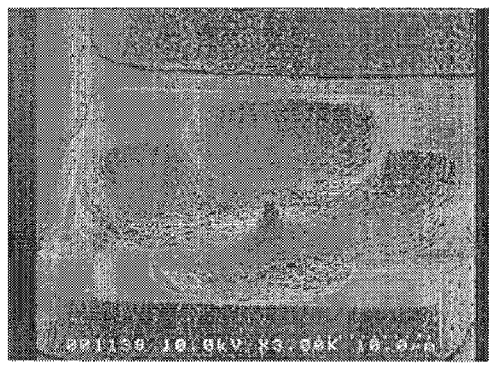
FIG. 4A is a scanning electron microscope (SEM) micrograph of a contact pad of a temporary chip attach carrier according to the second embodiment of the present invention.
Figure 4B:
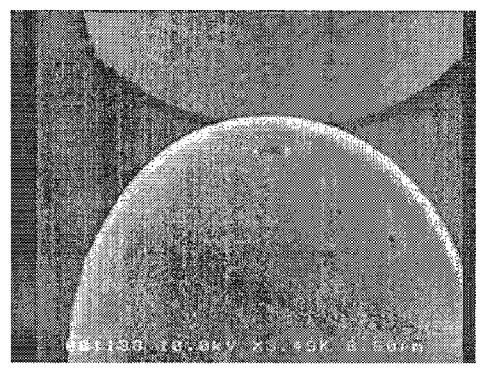
FIG. 4B is an SEM micrograph of a solder bump interconnect an integrated circuit chip after removal from the temporary chip attach carrier according to the second embodiment of the present invention.
Figure 4C:
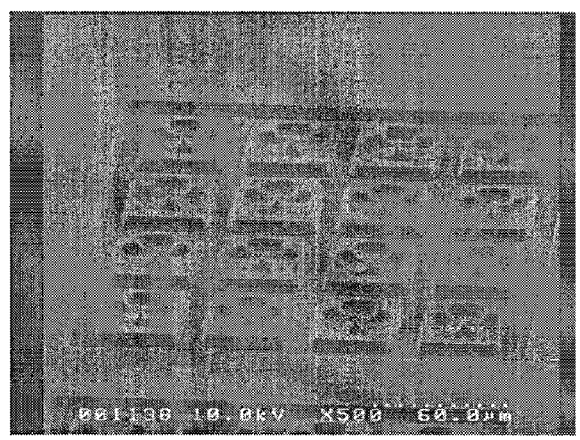
FIG. 4C is an SEM micrograph of an array of contact pads of the temporary chip attach carrier according to the second embodiment of the present invention.

Probe 195 may be fabricated by deposition of a conductive metal and etching to form an array of probes (see FIG. 4C). The etching step may simultaneously form probe tips 200 or a separate etch step may be used. In one example, probe pad 195 comprises copper or tungsten and may be coated with one or more layers of copper, chrome, nickel, cobalt, platinum, palladium, ruthenium, rhenium, gold, titanium, tungsten or combinations thereof or other electrically conductive contacts.

Integrated circuit chip(s) 115 (see FIG. 1) are attached to interposer 110 by aligning the integrated circuit chip to an array of probe pads 195, and applying a compressive force to push the probe tips 200 into solder bumps 165 using mechanical means such as spring clips 170 of FIG. 1. Then, TCA carrier 100 (see FIG. 1) is attached to a test board or in a socket attached to a test board using interconnects 120 for testing. Next integrated circuit chip(s) 115 are tested. Then TCA carrier 100 (see FIG. 1) is removed from the test board or socket. Next, integrated circuit chip(s) 115 are removed from interposer 110 by removing the compressive force and lifting off the integrated circuit chip(s).

Because there is no soldering required to attach an integrated circuit chip to the transposer in the second embodiment of the present invention cleaning of the probe tips after the integrated circuit chip has been tested and removed is easily performed using an organic or water based solvent or ultrasonic agitation or mechanical cleaning such as brushing or combinations thereof.

Optionally, after integrated circuit chip(s) 115 are removed from interposer 110, solder bumps 165 may be reflowed to restore the solder bumps to the shape they had before being attached to the interposer (essentially to remove the indents made by probe tips 200.)

FIG. 4A is a scanning electron microscope (SEM) micrograph of a contact pad of a temporary chip attach carrier according to the second embodiment of the present invention. In FIG. 4A a cloverleaf shape has been etched into a square probe pad to form depressions around a central probe tip. This cloverleaf shaped probe or alternate shaped probe provides a means to puncture through surface oxides on the surface of a solder bump (or a terminal pad) in order to make a low resistance electrical contact.

FIG. 4B is an SEM micrograph of a solder bump interconnect an integrated circuit chip after removal from the temporary chip attach carrier according to the second embodiment of the present invention. In FIG. 4B, a depression left in a solder bump after removal from a probe pad is clearly visible. It should be noted, that other than the small depression, the solder bump is un-deformed. If larger forces are used and the solder bump is significantly deformed, the chip bumps may be reflowed to restore the desired shape of the solder bumps. The probe tip must be pressed into the solder bump a small distance in order to reduce contact resistance caused by metal oxides on the surface of the solder bump. In one example, the diameter of the probe tip is about 5% or less than the diameter of solder bump where the solder bump contacts its chip pad.

FIG. 4C is an SEM micrograph of an array of contact pads of the temporary chip attach carrier according to the second embodiment of the present invention. FIG. 4C in combination with FIG. 4B indicate that the overall size of probe pads need not be smaller than the solder bumps or chip pads to which they can be attached. They can be larger, the same size, or smaller.

Figure 5A:
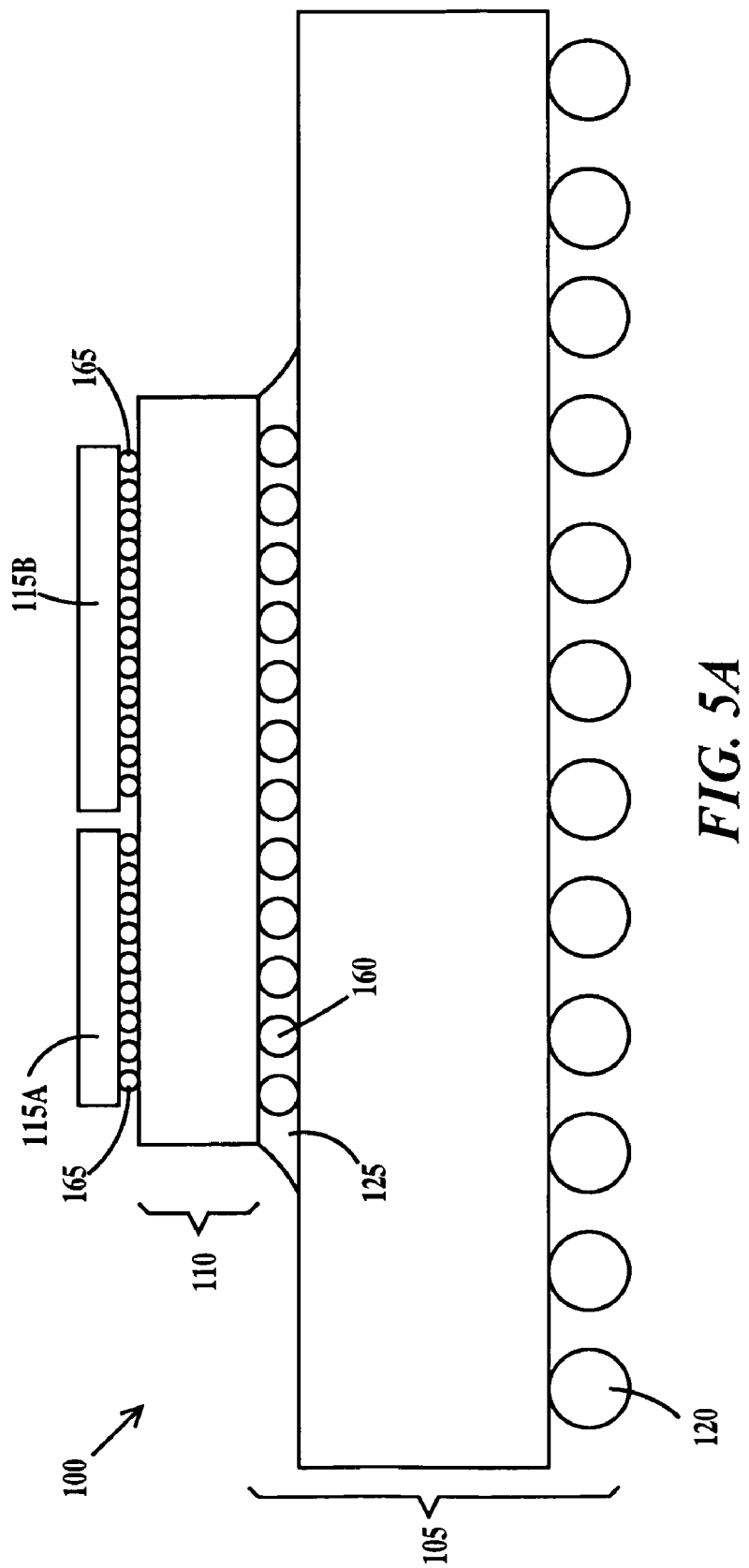
FIGS. 5A through 5D are side views of various arrangements of integrated circuit chips temporarily attached to a temporary chip attach carrier according to the embodiments of the present invention.
Figure 5B:
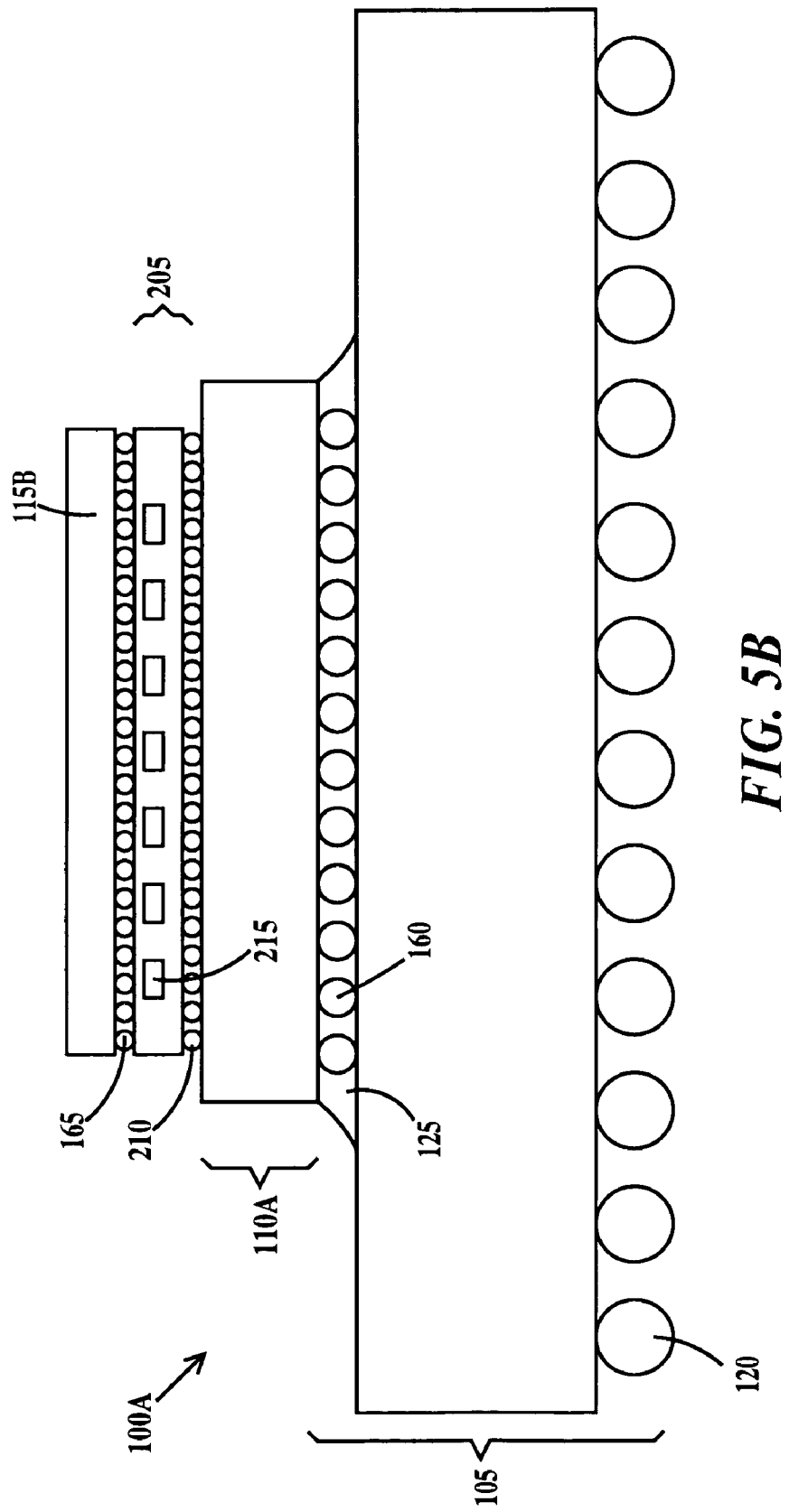
Figure 5C:
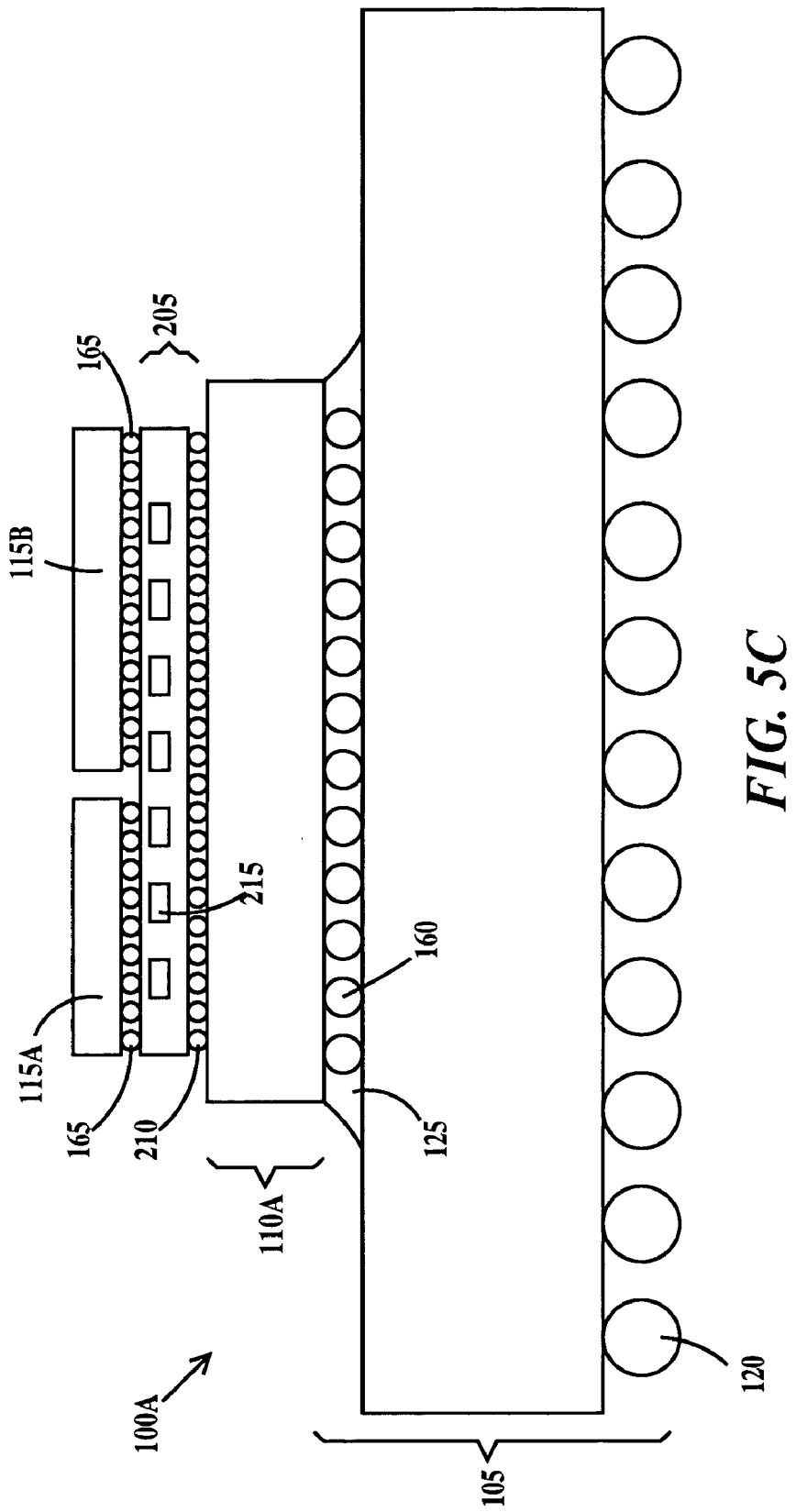
Figure 5D:
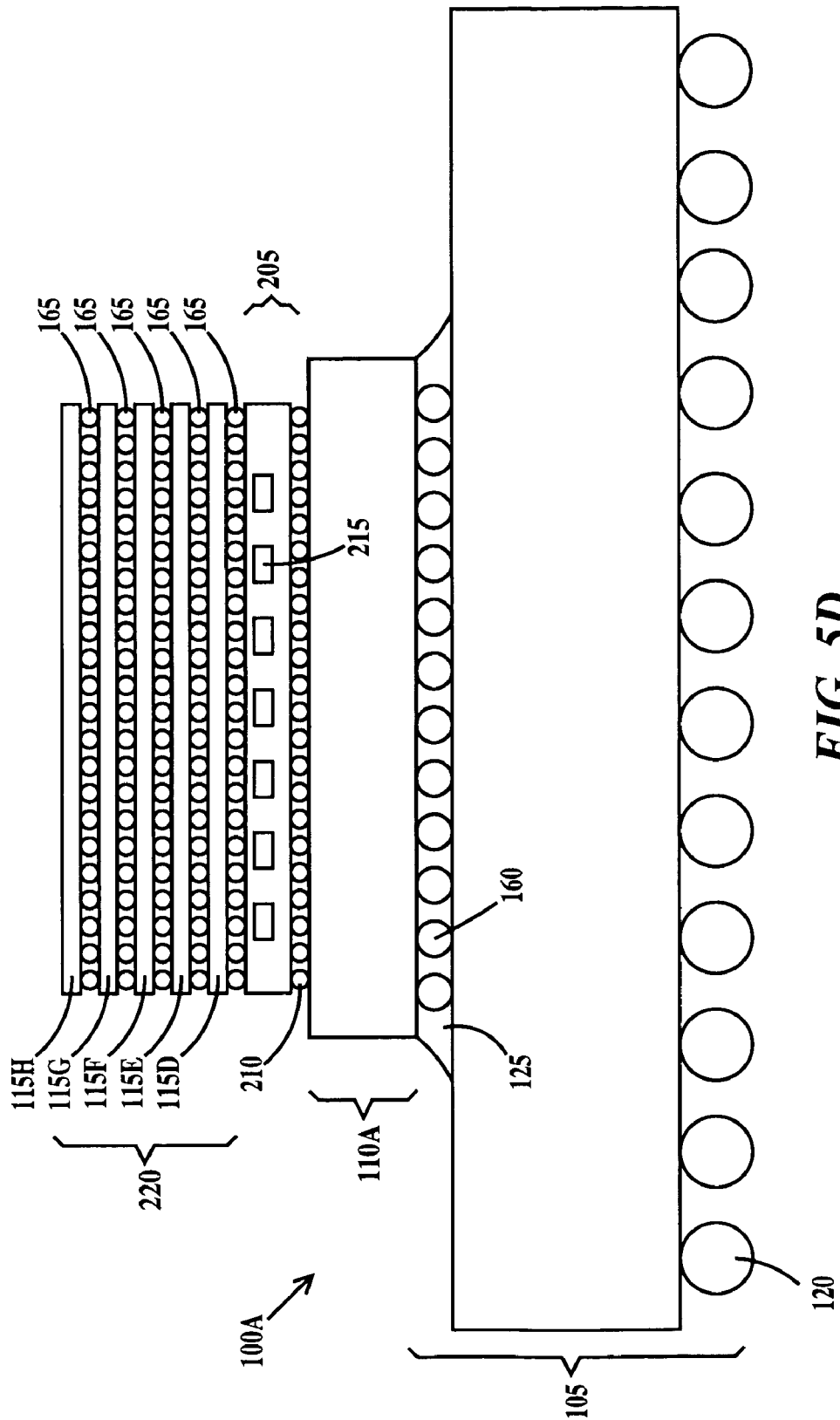

FIGS. 5A through 5D are side views of various arrangements of integrated circuit chips temporarily attached to a temporary chip attach carrier according to the embodiments of the present invention. In FIG. 5A, two integrated chips 115A and 115B are attached to interposer 110 of TCA carrier 100 by respective solder bumps 165. In FIG. 5B, an integrated circuit chip 115C is attached to an interposer 205 by solder bumps 165. In one example, interposer 205 advantageously comprises a silicon substrate (when integrated circuit chip 115C comprises a silicon substrate) or comprises the same material as the substrate material of integrated circuit chip 115C. Interposer 205 is attached to an interposer 110A of a TCA carrier 100A by solder bumps 210. Interposer 210 includes decoupling capacitors 215. Since decoupling capacitors are included in interposer 205, decoupling capacitors are not required in interposer 110A. However interposer 110A may include all the other features of interposer 110 (see FIG. 1 and description supra). FIG. 5C, is similar to FIG. 5B except in FIG. 5C, there are two integrated circuits chips 115 and 115B, attached to interposer 205. FIG. 5D is similar to FIG. 5B except a stack 200 of integrated circuits 115D, 115E, 115F, 115G and 115H are attached to interposer 205. While five integrated circuit chips are illustrated in FIG. 5D, there may be a few as two and as many as required. Interposer 205 is illustrated as including decoupling capacitors. Alternatively, interposer 205 may be absent or not include decoupling capacitors, in which case interposer 110 (see FIG. 1 and description supra) with decoupling capacitors may replace interposer 110A.

Thus the embodiments of the present invention provide a temporary chip attach (TCA) carrier suitable for use in testing fine pitch interconnect integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A temporary chip attach carrier for an integrated circuit chip, comprising:
    a carrier substrate, a first array of interconnects disposed on a bottom surface of said carrier substrate and a second array of interconnects disposed on a top surface of said carrier substrate, corresponding interconnects of said first and second arrays of interconnects electrically connected by wires in said carrier substrate;
    an interposer, said interposer comprising an electrically conductive interposer substrate, a first array of pads disposed on a top surface of said interposer and a second array of pads disposed on a bottom surface of said interposer substrate, corresponding pads of said first and second arrays of pads electrically connected by electrically conductive through vias passing through said interposer substrate, said through vias including an electrically conductive material and isolation electrically isolating said electrically conductive material from said interposer substrate, and pads of said second array of pads in direct physical and electrical contact with corresponding interconnects of said second array of interconnects; and
    wherein said interposer substrate comprises, except for said through vias, a continuous block of a same material as a substrate of said integrated circuit chip;
    wherein said first array of pads comprise probe pads, each probe pad having a probe tip surrounded by a depression formed in said probe pad, said depression lower than a perimeter region of the probe pad;
    wherein probe tips of pads of said first array of pads penetrate past surfaces of corresponding solder bumps into said solder bumps forming an electrically conductive mechanical contact.

2. The temporary chip attach carrier of claim 1, wherein said interposer substrate comprises silicon.

3. The temporary chip attach carrier of claim 1, wherein said pads of said first array of pads are solder pads having at least one dimension extending along said top surface of said interposer that is about 30% or less of a maximum dimension extending along a top surface of said integrated circuit chip of a terminal pad of an array of terminal pads disposed on said top surface of said integrated circuit chip.

4. The temporary chip attach carrier of claim 3, further including solder bump connections between terminal pads of said array of terminal pads of said integrated circuit chip and corresponding pads of said first array of pads.

5. The temporary chip attach carrier of claim 3, said interposer substrate further including:
    a set of heater elements in said interposer, each heater element of said set of heater elements disposed proximate to a corresponding pad of said first array of pads.

6. The temporary chip attach carrier of claim 1, wherein interconnects of said second array of interconnects are solder bumps.

7. The temporary chip attach carrier of claim 6, further including:
    a fill material between said top surface of said carrier substrate and said bottom surface of said interposer substrate.

8. The temporary chip attach carrier of claim 1, wherein said first array of pads comprise probe pads, having an probe tip surrounded by a depression formed in said probe pad, said depression lower than a perimeter region of the probe pad, and wherein each said probe tip is integral to a respective probe pad.

9. The temporary chip attach carrier of claim 1, further including:
    a wiring layer disposed on a top surface of said interposer substrate, said first array of pads on a top surface of said wiring layer, wires in said wiring layer connected between said first array of pads and said wires in said interposer substrate, a top surface of said wiring layer being said top surface of said interposer.

10. The temporary chip attach carrier of claim 9, said interposer substrate and wiring layer further including an electro-static discharge circuit, a temperature sensing circuit, a test pattern generator, a logic test circuit, a memory test circuit, a memory retention time test circuit or combinations thereof.

11. The temporary chip attach carrier of claim 9, further including:
    a set of heater elements in said wiring layer, each heater element of said set of heater elements disposed proximate to a corresponding pad of said first array of pads.

12. The temporary chip attach carrier of claim 9, further including:
    one or more decoupling capacitors in said wiring layer.

13. The temporary chip attach carrier of claim 9, further including:
    a power distribution plane in said wiring layer.

14. The temporary chip attach carrier of claim 1, further including:
    one or more decoupling capacitors in said interposer substrate.

15. The temporary chip attach carrier of claim 7, wherein said fill material completely fills the space between said top surface of said carrier substrate and said bottom surface of said interposer substrate not filled by said first array of interconnects.

16. The temporary chip attach carrier of claim 15, wherein said fill material comprises an epoxy resin or a silicon dioxide filled epoxy resin.

17. The temporary chip attach carrier of claim 1, further including:
    an additional interposer, said additional interposer comprising an electrically conductive additional interposer substrate, a third array of pads disposed on a top surface of said additional interposer and a fourth array of pads disposed on a bottom surface of said additional interposer substrate, corresponding pads of said third and fourth arrays of pads electrically connected by electrically conductive additional through vias passing through said additional interposer substrate, said additional through vias including an additional electrically conductive material and additional isolation electrically isolating said additional electrically conductive material from said additional interposer substrate, pads of said fourth array of pads electrically connected with corresponding pads of said first array of pads;

wherein said additional interposer includes decoupling capacitors; and wherein said additional interposer substrate comprises, except for said additional through vias, a continuous block of said same material as said substrate of said integrated circuit chip.

* * * * *